US010355479B2

(12) United States Patent
Mumtaz

(10) Patent No.: US 10,355,479 B2
(45) Date of Patent: Jul. 16, 2019

(54) INVERTERS

(71) Applicant: SolarCity Corporation, San Mateo, CA (US)

(72) Inventor: Asim Mumtaz, Redwood City, CA (US)

(73) Assignee: SolarCity Corporation, San Mateo, CA (US)

( * ) Notice: Subject to any disclaimer, the term of this patent is extended or adjusted under 35 U.S.C. 154(b) by 155 days.

(21) Appl. No.: 15/469,346

(22) Filed: Mar. 24, 2017

(65) Prior Publication Data

US 2017/0201100 A1 Jul. 13, 2017

Related U.S. Application Data

(63) Continuation of application No. 14/191,129, filed on Feb. 26, 2014, now Pat. No. 9,608,442, which is a
(Continued)

(30) Foreign Application Priority Data

Jan. 18, 2011 (GB) .................................... 1100796

(51) Int. Cl.
*H02H 7/16* (2006.01)
*H02J 3/00* (2006.01)
(Continued)

(52) U.S. Cl.
CPC .......... *H02J 3/00* (2013.01); *H01L 31/02021* (2013.01); *H02H 7/16* (2013.01);
(Continued)

(58) Field of Classification Search
CPC ....... H02J 3/00; H02J 3/383; H01L 31/02021; H02H 7/16; H02M 7/44; H02M 7/48; Y02E 10/563
(Continued)

(56) References Cited

U.S. PATENT DOCUMENTS 4,104,687 A 8/1978 Zulaski
4,626,983 A 12/1986 Harada et al.
(Continued)

FOREIGN PATENT DOCUMENTS

DE 100 64 039 A1 12/2001
EP 0642199 A1 3/1995
(Continued)

OTHER PUBLICATIONS

International Preliminary Report on Patentability for International Patent Application PCT/GB2012/050097, dated Jul. 23, 2013, 6 pages.
(Continued)

*Primary Examiner* — Hal Kaplan
(74) *Attorney, Agent, or Firm* — Kilpatrick Townsend & Stockton LLP

(57) ABSTRACT

We describe a photovoltaic power conditioning unit for delivering power from multiple photovoltaic panels to an ac mains power supply output, comprising: a dc input for receiving power from multiple photovoltaic panels; an ac output for delivering ac power to the ac supply; a bank of electrolytic energy storage capacitors for storing energy from the dc source for delivery to the ac supply; a dc-to-ac converter coupled to the ac output and having an input coupled to the bank for converting energy stored in the bank to ac power for the ac supply; and further comprising: a plurality of sense and control circuits, one for each capacitor in the bank, wherein each circuit is coupled in series with a capacitor, and is configured to disconnect the associated capacitor from the bank upon detection of a current flow through the associated capacitor of greater than a threshold current value.

19 Claims, 6 Drawing Sheets

Related U.S. Application Data continuation of application No. 13/244,226, filed on Sep. 23, 2011, now Pat. No. 8,674,548.

(51) Int. Cl.
  *H02J 3/38* (2006.01)
  *H02M 7/44* (2006.01)
  *H02M 7/48* (2007.01)
  *H01L 31/02* (2006.01)

(52) U.S. Cl.
  CPC .............. *H02J 3/383* (2013.01); *H02M 7/44* (2013.01); *H02M 7/48* (2013.01); *Y02E 10/563* (2013.01); *Y10T 307/724* (2015.04); *Y10T 307/729* (2015.04)

(58) Field of Classification Search
  USPC ............................................ 307/85, 86, 109
  See application file for complete search history.

(56) References Cited

U.S. PATENT DOCUMENTS

| | | | |
|---|---|---|---|
| 5,329,222 A | 7/1994 | Gyugi et al. | |
| 5,708,576 A | 1/1998 | Jones et al. | |
| 5,814,970 A | 9/1998 | Schmidt | |
| 5,859,772 A | 1/1999 | Hilpert | |
| 6,094,129 A | 7/2000 | Baiatu | |
| 6,281,485 B1 | 8/2001 | Siri | |
| 6,445,599 B1 | 9/2002 | Nguyen | |
| 6,657,419 B2 | 12/2003 | Renyolds | |
| 6,678,174 B2 | 1/2004 | Suzui et al. | |
| 6,940,735 B2 | 9/2005 | Deng et al. | |
| 7,906,870 B2 | 3/2011 | Ohm | |
| 7,919,953 B2 | 4/2011 | Porter et al. | |
| 8,017,437 B2 | 9/2011 | Yoo et al. | |
| 8,067,855 B2 | 11/2011 | Mumtaz et al. | |
| 8,089,785 B2 | 1/2012 | Rodriguez | |
| 8,184,460 B2 | 5/2012 | O'Brien et al. | |
| 8,369,113 B2 | 2/2013 | Rodriguez | |
| 8,461,809 B2 | 6/2013 | Rodriguez | |
| 8,674,548 B2 | 3/2014 | Mumtaz | |
| 9,608,442 B2 * | 3/2017 | Mumtaz ............ | H01L 31/02021 |
| 2002/0034083 A1 | 3/2002 | Ayyanar et al. | |
| 2002/0085397 A1 | 7/2002 | Suzui et al. | |
| 2005/0105306 A1 | 5/2005 | Deng et al. | |
| 2007/0035975 A1 | 2/2007 | Dickerson et al. | |
| 2007/0133241 A1 | 6/2007 | Mumtaz et al. | |
| 2008/0055941 A1 | 3/2008 | Victor et al. | |
| 2008/0266919 A1 | 10/2008 | Mallwitz | |
| 2008/0285317 A1 | 11/2008 | Rotzoll | |
| 2008/0294472 A1 | 11/2008 | Yamada | |
| 2008/0304298 A1 | 12/2008 | Toba et al. | |
| 2010/0214808 A1 | 8/2010 | Rodriguez | |
| 2010/0246230 A1 | 9/2010 | Porter et al. | |
| 2011/0205766 A1 | 8/2011 | Rodriguez | |
| 2012/0033463 A1 | 2/2012 | Rodriguez | |
| 2012/0039099 A1 | 2/2012 | Rodriguez | |
| 2012/0056484 A1 | 3/2012 | Mumtaz | |
| 2012/0081937 A1 | 4/2012 | Phadke | |
| 2013/0235637 A1 | 9/2013 | Rodriguez | |

FOREIGN PATENT DOCUMENTS

| | | |
|---|---|---|
| EP | 1 475 882 A1 | 11/2004 |
| EP | 1 974 453 | 10/2008 |
| EP | 2 219 276 A1 | 8/2010 |
| EP | 2 348 597 A1 | 7/2011 |
| EP | 2 666 219 | 4/2014 |
| GB | 2 399 465 A | 9/2004 |
| GB | 2 415 841 A | 1/2006 |
| GB | 2 434 490 B | 4/2009 |
| GB | 2 454 389 A | 5/2009 |
| GB | 2487368 B | 12/2012 |
| GB | 2487495 B | 12/2012 |
| WO | 2004/008619 A2 | 1/2004 |
| WO | 2005/015584 A2 | 2/2005 |
| WO | 2006/048688 A1 | 5/2006 |
| WO | 2007/080429 A2 | 7/2007 |
| WO | 2012/098390 A2 | 7/2012 |

OTHER PUBLICATIONS

International Search Report for International Patent Application PCT/GB2005/050197, dated Feb. 14, 2006, 4 pages.

Written Opinion for International Patent Application PCT/GB2005/050197, dated Feb. 14, 2006, 9 pages.

International Search Report for International Patent Application PCT/GB2007/050014, dated Jan. 23, 2008, 3 pages.

Written Opinion for International Patent Application PCT/GB2007/050014, dated Jan. 23, 2008, 5 pages.

Brunello, Gustavo, et al., "Shunt Capacitor Bank Fundamentals and Protection," 2003 Conference for Protective Relay Engineers, Apr. 8-10, 2003, pp. 1-17, Texas A&M University, College Station, TX, USA.

Cordonnier, Charles-Edouard, et al., "Application Considerations for Sensefet Power Mosfet Devices," PCI Proceedings, May 11, 1987, pp. 47-65.

Kotsopoulos, Andrew, et al., "Predictive DC Voltage Control of Single-Phase PV Inverters with Small DC Link Capacitance," 2003 IEEE International Symposium, Jun. 9-11, 2003, pp. 793-797.

Krein, Philip T., et al., "Cost-Effective Hundred-Year Life for Single-Phase Inverters and Rectifiers in Solar and LED Lighting Applications Based on Minimum Capacitance Requirements and a Ripple Power Port," 24th Annual IEEE Applied Power Electronics Conference and Exposition, Feb. 15-19, 2009, pp. 620-625, Washington, DC, USA.

* cited by examiner

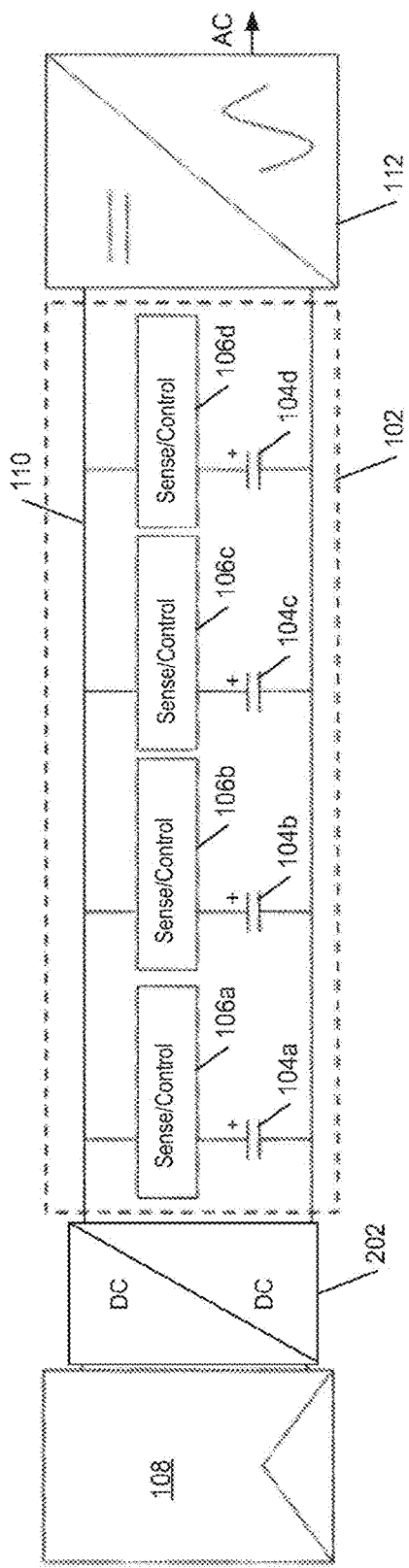
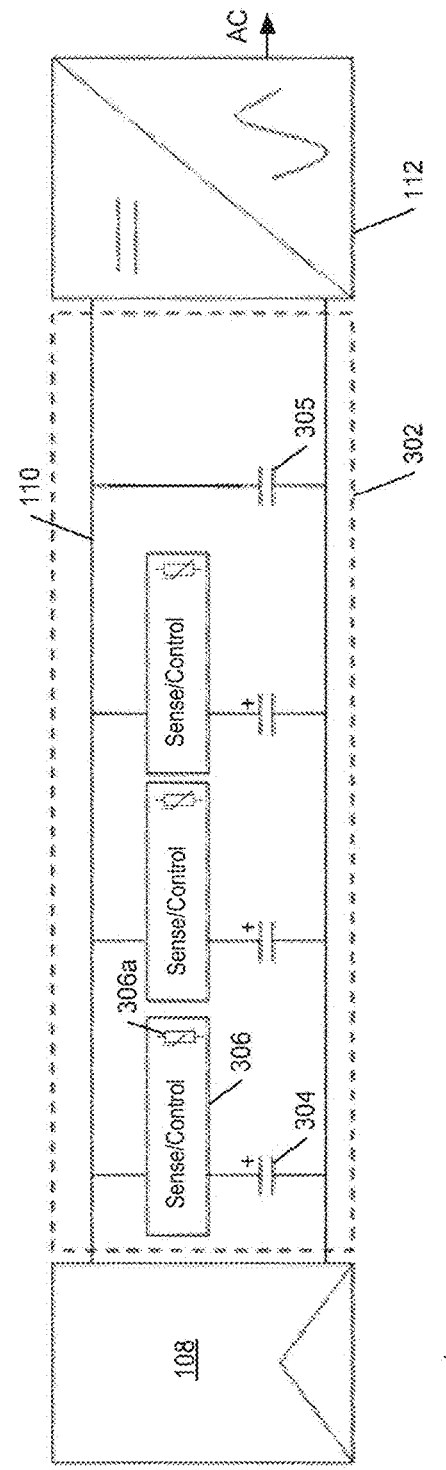
Figure 2
Figure 3

INVERTERS

CROSS-REFERENCES TO RELATED APPLICATIONS

This application is a continuation of U.S. application Ser. No. 14/191,129, filed Feb. 26, 2014, which is a continuation of U.S. application Ser. No. 13/244,226, filed Sep. 23, 2011, now U.S. Pat. No. 8,674,548, issued Mar. 18, 2014, which claims the benefit of an earlier-filed United Kingdom Patent Application 1100796.0, filed Jan. 18, 2011, issued as GB2487368, all of which are incorporated by reference herein.

FIELD OF THE INVENTION

This invention relates to power conditioning units for delivering power from a dc power source, in particular one or more photovoltaic panels, to an ac output, either for connecting directly to the mains (grid) utility supply or for powering mains (grid) devices, independently from the mains utility supply. More particularly the invention relates to techniques for increasing the reliability of such devices.

BACKGROUND OF THE INVENTION

We have previously described techniques for energy control in power conditioning units (inverters) which enable the construction of a dc-to-mains power converter which does not need to use electrolytic capacitors (see U.S. Ser. No. 12/160,743 and GB2,434,490A). We now describe alternative techniques for increasing the reliability of a solar inverter where electrolytic capacitors are employed. Such techniques are important because electrolytic capacitors are prone to failure, especially at high temperatures.

Electrolytic capacitors have a number of different failure modes, including going open circuit and going short circuit. Open circuit failure can be caused, for example, by loss of electrolyte, for example through vaporisation, and this may be preceded by a drop in capacitance and an increase in dissipation factor (tan δ) or the ESR-equivalent series resistance of the capacitor). Moreover increase in the ESR can cause an increase in local heating and hence electrolyte evaporation, causing a thermal runaway effect. A short circuit failure can be caused by, for example, local breakdown in a dielectric separator or oxide layer. Protection of a shunt capacitor bank is described in 'Shunt Capacitor Bank Fundamentals and Protection', Brunello, Kasztenny and Wester, 2003 Conference for Protective Relay Engineers— Texas A&M University, Apr. 8-10, 2003, College Station Tex.

Bearing in mind the above described failure modes, we will describe techniques to increase the reliability of solar inverters, in particular where electrolytic capacitors are employed. In embodiments these techniques are particularly useful in single stage power circuits for photovoltaic inverters, since these have fewer switching stages than multi-stage power circuits and can therefore have better efficiencies. More particularly, single stage photovoltaic inverters use a bank of electrolytic capacitors at the input, which enables energy storage during the zero crossing of the grid supply, and allows a stable input voltage which facilitates maximum power point tracking (MPPT).

Background prior art can be found in: EP1475882A2; GB2399465A; EP0642199A1; U.S. Pat. No. 6,094,129A and U.S. Pat. No. 5,859,772A.

SUMMARY OF THE INVENTION

According to a first aspect of the invention there is therefore provided a photovoltaic power conditioning unit for delivering power from one or more photovoltaic panels to an ac mains power supply output, the power conditioning unit comprising: a dc input for receiving power from said one or more photovoltaic panels; an ac output for delivering ac power to said ac mains power supply; a bank of electrolytic energy storage capacitors for storing energy from said dc power source for delivering to said ac mains power supply; a dc-to-ac converter coupled to said ac output and having an input coupled to said bank of electrolytic energy storage capacitors for converting energy stored in said bank of electrolytic energy storage capacitors to ac power for said ac mains power supply; and further comprising: a plurality of sense and control circuits, one for each of said electrolytic energy storage capacitors of said bank of electrolytic energy storage capacitors, wherein each said sense and control circuit is coupled in series with a respective said energy storage capacitor, and wherein each said sense and control circuit is configured to disconnect the associated electrolytic energy storage capacitor from said bank of capacitors upon detection of a current flow through the associated electrolytic energy storage capacitor of greater than a threshold current value.

In some preferred embodiments the threshold current value, Ith, is determined by:

$$I_{th} > \frac{I_{total}}{(N-n)} \cdot F$$

where N is the total number of capacitors in the bank, n is the number of (electrolytic) capacitors which are permitted to fail, Itotal is the maximum instantaneous current flowing onto or off the entire bank of energy storage capacitors when the power conditioning unit is operating at a maximum rated ac output power, and F is a factor, greater than unity, providing an additional margin for triggering the sense and control circuit. For example in embodiments F may be of order two. Broadly speaking as each capacitor fails the current flowing onto/off the others increases and the current threshold could be set so that it is sufficient to enable a permitted minimum, for example just one, capacitor to provide the energy storage function. Thus in embodiments (N−n) may be equal to one.

In embodiments the sense and control unit comprises a fuse with a rating determined by the time-averaged square of the total current flowing onto/off the bank of energy storage capacitors. More particularly, as well as the aforementioned instantaneous current threshold, the fuse may be configured such that, on average, when only a single capacitor (or in the general case, n capacitors) is operating the fuse maintains this capacitor connected with the additional margin factor F. In some preferred approaches, however, a sense and control circuit comprises a senseFET, using one or both of an internal channel resistance and an external resistor to sense the current flowing onto/off the energy storage capacitor. More generally, a current-sense resistor in series with a (power) semiconductor switching device may be employed. In some preferred embodiments the sense and control circuit further comprises a low-pass filter in a sense-control loop of the circuit to attenuate a high-frequency component arising from switching of the dc-to-ac converter. In embodiments this low-pass filter may have a corner frequency of at least 1 KHz or 10 KHz. Broadly speaking, in operation the capacitor current has a first component at the ac mains frequency (more exactly at twice the ac mains frequency), and a second component perhaps the switching frequency of the output converter, which is typically quite high, for example in the range 50-100 KHz. Filtering this latter component helps to achieve reliable operation of the inverter.

In embodiments an inverter as described above may 'fail gracefully' in that the maximum output power may gradually diminish as electrolytic capacitors of the bank fail. Depending upon the system architecture in a system with multiple inverters others of the inverters may take over to deliver power in such a situation. However in embodiments, capacitors in the capacitor bank may be up-rated to enable operation of the inverter even when one or more of the capacitors have failed. Thus in embodiments a single energy storage capacitor of the bank has a capacitance which is sufficient for an ac ripple voltage component at a frequency of the ac mains power supply not to pull an instantaneous voltage on the bank below zero at the maximum rate of ac output power of the inverter. Thus, broadly speaking, in embodiments the power rating of the minimum design—permitted number of capacitors, n, is sufficient to store enough energy during a single half cycle of the ac grid mains to provide the maximum rated ac output power. This energy storage criterion may be based upon whether or not the instantaneous voltage on the capacitor bank falls to zero at a zero-crossing point of the ac grid mains; when a low power output is provided a ripple is superimposed on the dc voltage on the capacitor bank, but as the output power increases the magnitude of the ripple increases until the instantaneous voltage on the capacitor bank falls to zero at the zero-crossing points of the ac grid mains. This in turn defines the aforementioned criterion for operating the one (or n) capacitors of the bank in order still to be able to provide the desired maximum rate of output power.

Additionally or alternatively, in some preferred embodiments the capacitor bank comprises mixed electrolytic and non-electrolytic capacitors. In this way even if all the electrolytic capacitors fail the inverter is still capable of operating, albeit at a down-rated maximum output power. Again such an approach may be supported by a system architecture in which multiple inverters provide ample power to the grid mains, more particularly a 'microinverter'—based system in which a single panel (or pair of panels) is connected to a dedicated inverter.

In embodiments in which the capacitor bank includes non-electrolytic as well as electrolytic capacitors, a capacitor technology control circuit may be included to control selective connection of the electrolytic capacitors to the internal dc link. In this way the inverter can implement selective control of whether or not electrolytic capacitors are employed in the bank of capacitors. Such an approach may be used, for example, to use electrolytic/non-electrolytic capacitors selectively based on temperature and/or operating conditions such as start-up.

The capacitor technology control circuit may comprise part of the sense and control circuit associated with each electrolytic energy storage capacitor, or a separate arrangement may be employed for example using a dedicated microprocessor. In embodiments a temperature sensor such as a thermistor may be employed to sense the temperature of the inverter and/or a temperature of each of the electrolytic capacitors, in order to disconnect a selected, or all of the electrolytic capacitors when the sensed temperature is below (or above) a threshold. For example, the electrolyte in a an electrolytic capacitor may freeze at temperatures below 0°C, for example around −10 °C, and an inverter, particularly a micro inverter mounted immediately behind a solar panel, may experience such low temperatures. The capacitor technology control circuit may thus switch out the electrolytic capacitors at low temperatures and/or at start-up of the inverter (sunrise) so that the electrolytic capacitors are not used until they have warmed sufficiently. Optionally the temperature threshold may be adapted over time.

Additionally or alternatively in embodiments two or more banks of electrolytic energy storage capacitors may be provided together with a capacitor bank control circuit to selectively connect one or other of the banks to the dc link for the dc-to-ac converter. In embodiments the capacitor bank control circuit is configured to time-multiplex use of the banks of electrolytic energy storage capacitors, for example selecting each of a pair of banks on alternate days. Counter-intuitively, such an approach provides increased redundancy over simply increasing the number of capacitors in a single capacitor bank, in part because the capacitors have an overall reduced use time, albeit at higher currents than if all the capacitors were in a single bank, and also because there will come a point at which only a single capacitor bank remains. In embodiments, therefore, the capacitor bank control circuit is configured to avoid the aforementioned time-multiplexed use of a bank if it is detected (for example by monitoring the sense and control circuits) that all the energy storage capacitors in the bank have failed. Overall this increases the lifetime of an inverter.

In embodiments the above described techniques are particularly advantageous in power conditioning units which have just a single power conversion stage (dc-to-ac). However for other reasons, in part dependent upon the system architecture, as mentioned above, the techniques described can be particularly advantageous for inverters with a relatively low maximum power rating, for example less than 1000 W or more particularly less than 600 W. Apart from reliability aspects relating to graceful degradation as described above, such microinverters also present special problems because they are generally located immediately adjacent to or behind a solar panel and can thus be exposed to both hot and cold temperature extremes, both of which can deleteriously effect the performance/lifetime of an electrolytic capacitor. In embodiments the above described techniques may be employed in an inverter with a relatively low dc link voltage of a dc link to which the capacitor bank is connected, for example less than 50V, in other applications, in particular microinverter applications, a dc-to-dc converter is employed at the input stage to provide a high voltage dc link, for example greater than 300V, 400V or 500V. Similarly in such systems because the stored energy scales as a square of the voltage the number of capacitors in a capacitor bank may be reduced, for example to less than 20 or less than 10 capacitors and/or providing a total capacitance of less than 50 mF, 20 mF or 10 mF. Again this approach is particularly suited to microinverters with a power output of less than 600 W, 500 W or 400 W.

In a related aspect of the invention provides a method of enhancing the reliability of a photovoltaic power conditioning unit for delivering power from one or more photovoltaic panel to an ac mains power supply output, the power conditioning unit comprising: a dc input for receiving power from said one or more photovoltaic panels; an ac output for delivering ac power to said ac mains power supply; and further comprising: a bank of electrolytic energy storage capacitors for storing energy from said dc power source for delivering to said ac mains power supply output; a dc-to-ac converter coupled to said ac output and having an input coupled to said bank of electrolytic energy storage capacitors for converting energy stored in said bank of electrolytic energy storage capacitors to ac power for said ac mains power supply; the method comprising: disconnecting an electrolytic energy storage capacitor from said bank of capacitors upon detection of a current flow though the associated electrolytic energy storage capacitor of greater than a threshold current value; wherein said threshold current value, is determined by $$I_{th} > \frac{I_{total}}{(N-n)} \cdot F$$

where N is a total number of capacitors in said bank of capacitors, n is a number of capacitors which are permitted to fail, F is a factor equal to or greater than unity and Itotal is the maximum instantaneous current flowing onto or off said bank of energy storage capacitors when said power conditioning unit is operating at a maximum rated ac output power.

Providing additional electrolytic energy storage capacitors, as described above, also facilitates power factor control and/or VAR (volt amperes reactive) correction. Thus embodiments of the above-described aspects of the invention may incorporate power factor control/VAR correction also using the electrolytic capacitor bank.

BRIEF DESCRIPTION OF THE DRAWINGS

These and other aspects of the invention will now be further described, by way of example only, with reference to the accompanying figures in which:

FIG. 2 shows a second embodiment of a photovoltaic power conditioning unit according to an aspect of the invention;

FIG. 3 shows a third embodiment of a photovoltaic power conditioning unit according to an aspect of the invention;

DETAILED DESCRIPTION OF PREFERRED EMBODIMENTS

Figure 1A:
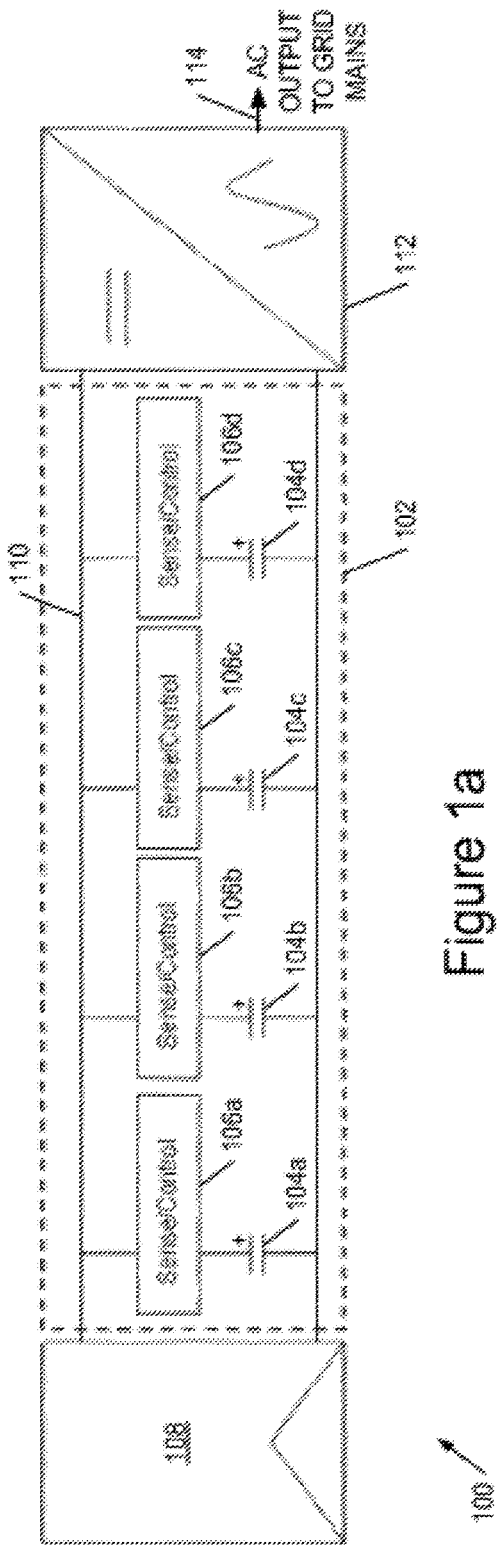
FIGS. 1a and 1b show, respectively, a first embodiment a photovoltaic power conditioning circuit according to the invention, and an example of a sense and control circuit for the power conditioning unit.

Referring to FIG. 1, this shows an embodiment of a photovoltaic power conditioning unit 100 comprising a bank 102 of parallel-connected electrolytic capacitors 104a-d each with a respective sense/control circuit 106a-d. The power conditioning unit receives input from one or more photovoltaic panels 108 which provide dc power to a dc link 110 of the inverter, which in turn provides power to a dc-to-ac converter 112 which provides an ac output 114 to the grid mains.

Figure 1B:
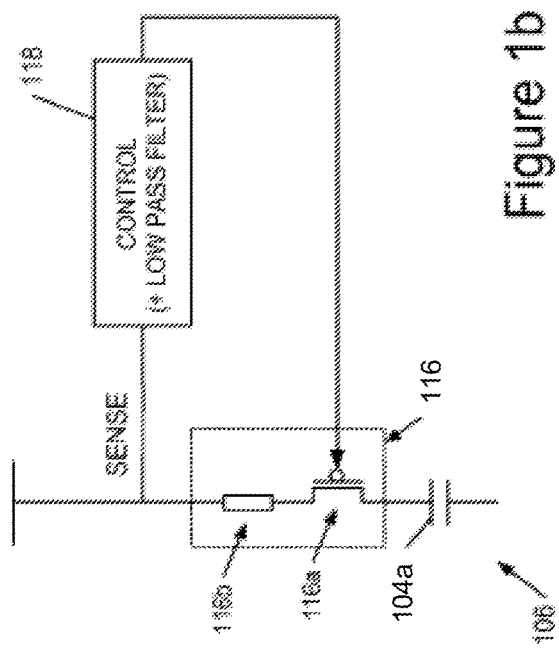

An example embodiment of the sense control circuit 106 is shown in FIG. 1b, in the example comprising a senseFET 116 comprising a MOSFET 116a and a current-sensing resistance 116b. A voltage on the current-sensing resistance is sensed by a control circuit 118, which in preferred embodiments incorporates a low-pass filter to attenuate a current-sense signal at the switching frequency of dc-to-ac converter 112. The control circuit 118 is configured to switch FET 116 off when the sensed-current exceeds a threshold current. In embodiments the control circuit 118 may be integrated together with the senseFET. In an alternative arrangement the sense/control circuit 106 may incorporate a fuse.

In operation current flows onto and off the capacitor bank 102 at twice the frequency of the ac grid mains, as power is output to the grid mains. A peak output current I is shared between the N capacitors of the bank, or between fewer capacitors when one or more of the capacitors has failed, until, but only a single capacitor remains, all the current flows onto/off this single remaining capacitor.

Figure 6B:
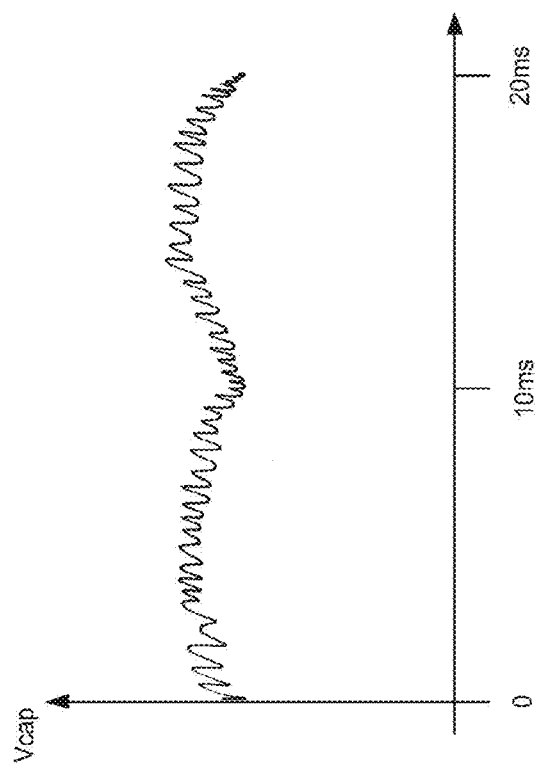
FIGS. 6a and 6b show example capacitor bank voltage waveforms during operation of the power conditioning unit at FIG. 1 at, respectively, maximum rated load and reduced load.
Figure 6A:
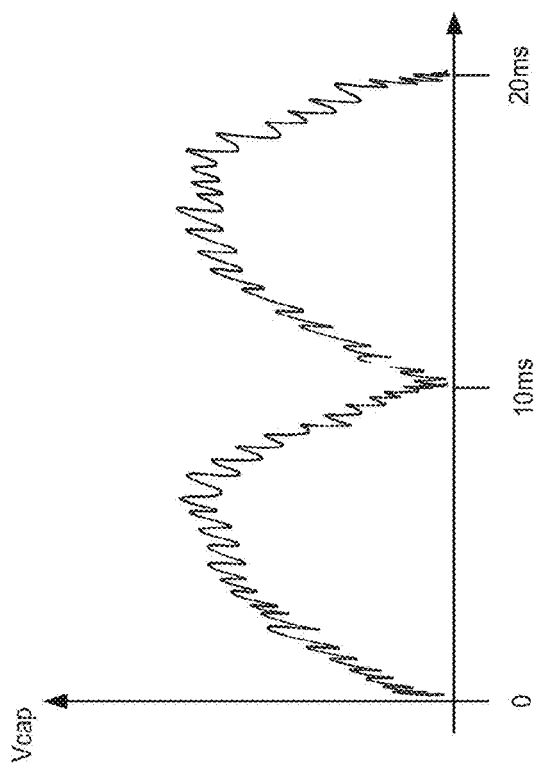
Figure 7:
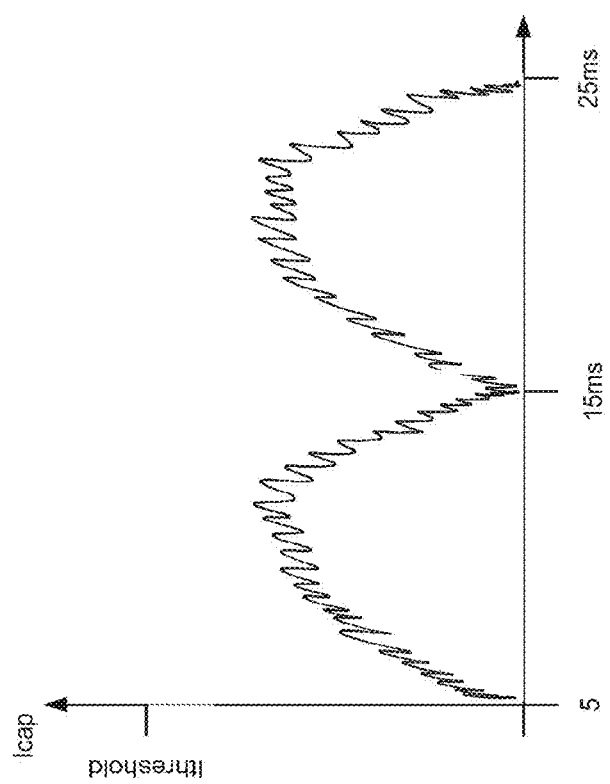
FIG. 7 shows an example of a waveform for current flow onto/off the capacitor bank of the power conditioning unit of FIG. 1.

An example current capacitor waveform is shown in FIG. 7; corresponding voltage waveforms for maximum and reduced load are shown in FIGS. 6a and 6b. The maximum current onto/off a capacitor occurs when the voltage across the capacitor bank falls to substantially zero and the current threshold should be set so that the sense/control circuit does not disconnect the capacitor when only a single working capacitor remains in the capacitor bank and this maximum current is flowing. Preferably a safety margin or surge factor is also applied.

In operation if the sensing circuit establishes that a capacitor has failed short circuit (or is approaching failure) then a switch is triggered to remove this capacitor from the capacitor bank. Each capacitor has its own associated sense/control circuit. Because electrolytic capacitors are low cost, in preferred embodiments the inverter may be designed such that even a single capacitor can sustain the operation of a circuit at maximum rate of output power. Multiple such capacitors are then connected in parallel to provide a redundant system. This enables the inverter to last for an extended period of time. This is particularly important for solar PV (photovoltaic) microinverters, which should be able to provide a lifetime of at least 20 years to match the lifetime of the solar panels.

In FIGS. 2-5 like elements to those of FIG. 1 are illustrated by like reference numerals. Thus, referring to FIG. 2, this shows a second embodiment of a photovoltaic power conditioning unit 200 incorporating a dc-to-dc converter 202 at the front end to raise the relatively low dc input voltage from a PV panel to a much higher voltage for dc link 110, for example of order 400-500V. Such an arrangement can reduce the size of capacitors needed on the dc link (recalling that energy stored in the capacitor is proportional to voltage squared).

FIG. 3 shows an embodiment of a photovoltaic power conditioning unit 300 in which the capacitor bank 302 comprises a mix of electrolytic capacitors 304 and non-electrolytic capacitors 305, for example thin film (polypropylene) capacitors. Only the electrolytic capacitors need a sense/control circuit 306, and in embodiments this may include a temperature sensing element 306a such as a thermistor. The sense/control circuit 306 may then be configured to respond to temperature, more particularly to de-couple an electrolytic capacitor 304 from the capacitor bank at high and/or low temperature extremes. This enables the life of the inverter to be further extended, by reducing the stresses on the electrolytic capacitors by limiting their operational temperature range.

Figure 4:
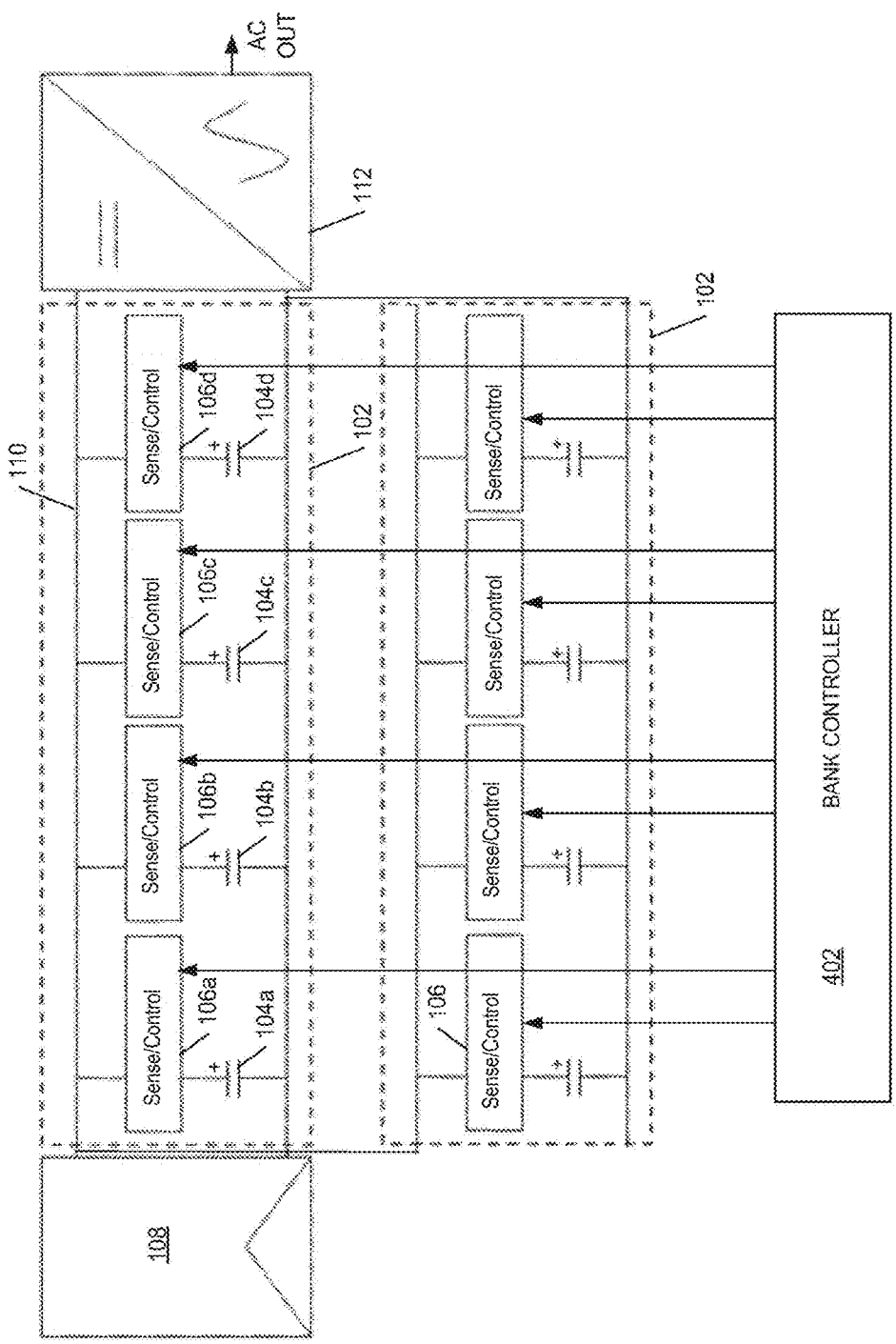
FIG. 4 shows a fourth embodiment of a photovoltaic power conditioning unit according to an aspect of the invention.

Referring now to FIG. 4 this shows a further embodiment of a photovoltaic power conditioning unit 400 comprising a pair of capacitor banks 102, and in which the sense/control circuits 106 are under the control of a bank controller 402, for example an embedded microprocessor. This arrangement allows time-multiplexed use of the capacitor banks (and/or individual capacitors within a capacitor bank). In this way, for example, alternate banks may be used on alternate days, to increase redundancy and extend the life of the inverter.

Figure 5:
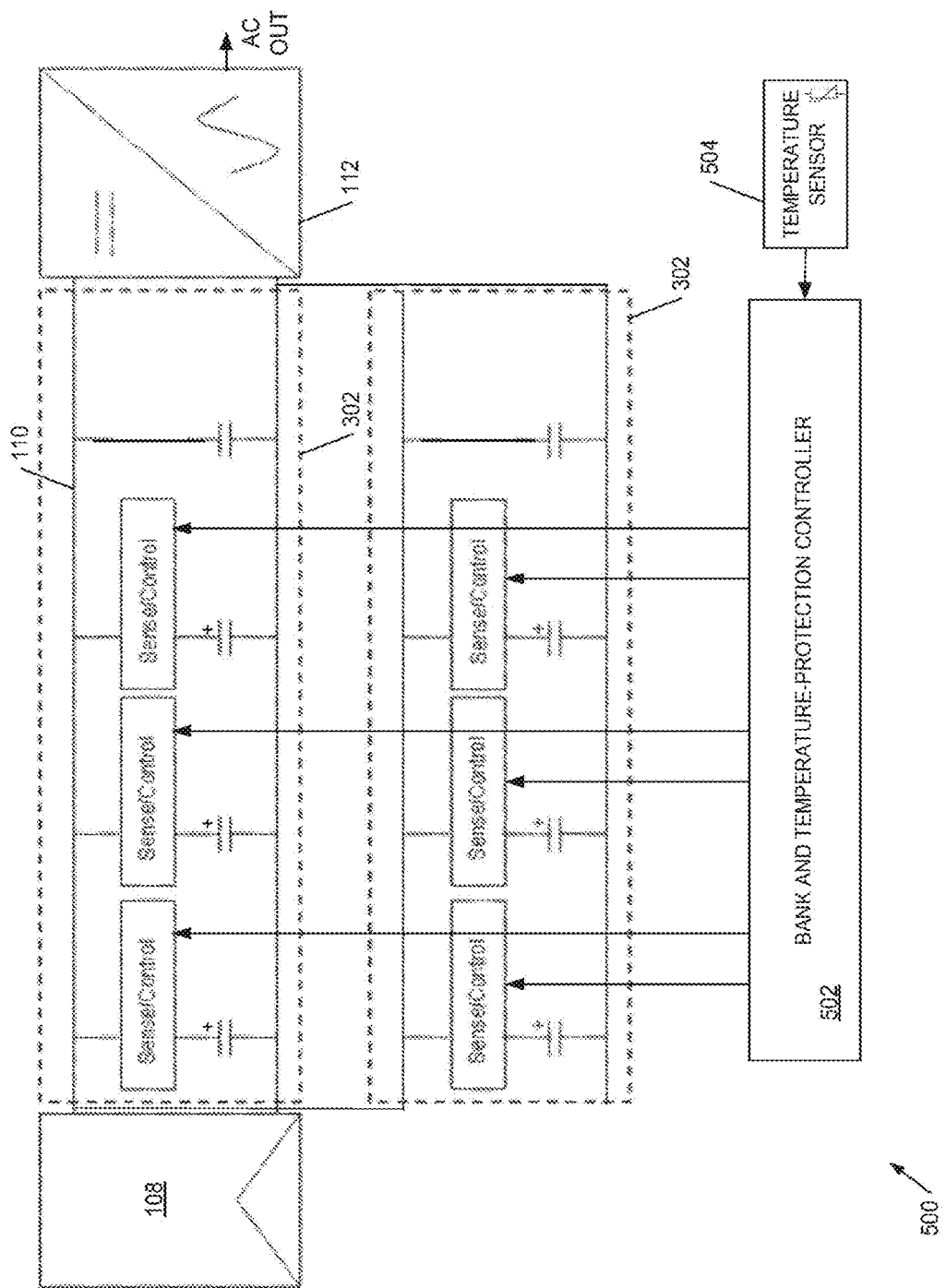
FIG. 5 shows a fifth embodiment of a photovoltaic power conditioning unit according to an aspect of the invention.

FIG. 5 shows a further embodiment of a photovoltaic power conditioning unit 500, employing a bank and temperature-protection controller 502, and employing mixed electrolytic/non-electrolytic capacitor banks 302. In the arrangement of FIG. 5 controller 502 is configured to perform bank time-multiplexing as described with reference to FIG. 4, and also has an input from a temperature sensor 504, for example a thermistor, so that selective coupling of electrolytic capacitors into a capacitor bank 302 can be performed by controller 502, again to limit an operating temperature range of the electrolytic capacitors to further increase device lifetime. Temperature sensor 504 may be thermally coupled to the inverter enclosure and/or to an internal heat sink. A suitable degree of thin film capacitance may be provided by, say, of order 100 thin film capacitors to provide a capacitance of order 1 mF.

No doubt many other effective alternatives will occur to the skilled person. It will be understood that the invention is not limited to the described embodiments and encompasses modifications apparent to those skilled in the art lying within the spirit and scope of the claims appended hereto.

What is claimed is:

1. A photovoltaic (PV) power system configured to provide AC power to an AC mains, the PV power system comprising:
    one or more photovoltaic panels having a DC output;
    a DC to AC converter having a converter input and an AC output coupled to the AC mains;
    a first bank of energy storage capacitors having a first bank input coupled to the DC output, and a first bank output coupled to the DC to AC converter input; and
    a second bank of energy storage capacitors having a second bank input coupled to the DC output, and a second bank output coupled to the DC to AC converter input; and
    a control circuit configured to alternately disconnect one or more energy storage capacitors of the first bank of energy storage capacitors and one or more energy storage capacitors of the second bank of energy storage capacitors, based on a timer.

2. The PV power system of claim 1 wherein the first bank of energy storage capacitors includes a plurality of electrolytic capacitors and each of the plurality of electrolytic capacitors is coupled to a separate respective control circuit that is configured to disconnect each respective electrolytic capacitor when at least one detected parameter goes beyond a predetermined threshold.

3. The PV power system of claim 2 wherein the control circuit is configured to perform time-multiplexing of the first bank of energy storage capacitors and the second bank of energy storage capacitors such that each of the first and the second banks of energy storage capacitors are used by the PV power system for an equal amount of time.

4. The PV power system of claim 2 wherein the control circuit is further configured to selectively decouple each capacitor of the first bank of energy storage capacitors and each capacitor of the second bank of energy storage capacitors that fail during operation of the PV power system.

5. The PV power system of claim 1 wherein the control circuit disconnects at least one of the one or more capacitors based on a detected current flow through the associated capacitor that exceeds a threshold current level.

6. The PV power system of claim 5 wherein the control circuit includes a senseFET configured to disconnect the associated capacitor upon detecting a current flow through the associated capacitor that is greater than a threshold current value.

7. The PV power system of claim 5 wherein the control circuit includes a fuse that is configured to disconnect the associated capacitor upon detecting a current flow through the associated capacitor that is greater than a threshold current value.

8. The PV power system of claim 1 wherein the control circuit disconnects at least one of the one or more capacitors based on a detected temperature going beyond a threshold temperature.

9. The PV power system of claim 8 wherein the control circuit disconnects the at least one of the one or more capacitors when a detected temperature goes above a predetermined threshold temperature.

10. The PV power system of claim 8 wherein the control circuit disconnects the at least one of the one or more capacitors when a detected temperature goes below a predetermined threshold temperature.

11. The PV power system of claim 8 wherein the detected temperature is a temperature of at least one of: an enclosure of the PV power system, a heatsink of the PV power system and at least one of the one or more capacitors.

12. A photovoltaic (PV) power conditioning unit for delivering power from one or more photovoltaic panels to an AC mains, the power conditioning unit comprising:
    a DC input for receiving power from the one or more photovoltaic panels;
    an AC output for delivering AC power to the AC mains;
    a first bank of energy storage capacitors for storing energy from the DC input for delivery to the AC mains;
    a second bank of energy storage capacitors for storing energy from the DC input for delivery to the AC mains;
    a DC-to-AC converter coupled to the AC output and having an input coupled to the first bank of energy storage capacitors for converting energy stored in the first bank of energy storage capacitors to AC power for the AC mains; and
    a control circuit configured to alternately disconnect one or more energy storage capacitors of the first bank of energy storage capacitors and one or more energy storage capacitors of the second bank of energy storage capacitors, based on a timer.

13. The PV power conditioning unit of claim 12 wherein the first bank of energy storage capacitors includes a plurality of electrolytic capacitors and each of the plurality of electrolytic capacitors is coupled to a separate respective control circuit that is configured to disconnect each respective electrolytic capacitor when at least one of the one or more detected parameters go beyond a predetermined threshold.

14. The PV power conditioning unit of claim 12 wherein the first bank of energy storage capacitors includes a first plurality of electrolytic capacitors and the second bank of energy storage capacitors includes a second plurality of electrolytic capacitors; and wherein the control circuit alternately disconnects one or more of the first plurality of electrolytic capacitors and one or more of the second plurality of electrolytic capacitors, based on the timer.

15. The PV power conditioning unit of claim 14 wherein the control circuit is configured to perform time-multiplexing of the first plurality of electrolytic capacitors and the second plurality of electrolytic capacitors such that each of the first and the second plurality of electrolytic capacitors are used by the PV power conditioning unit for an equal amount of time.

16. The PV power conditioning unit of claim 14 wherein the control circuit is further configured to selectively decouple all of the first plurality of electrolytic capacitors and all of the second plurality of electrolytic capacitors that fail during operation of the power conditioning unit.

17. The PV power conditioning unit of claim 12 wherein the control circuit disconnects at least one of the one or more capacitors based on a detected current flow through the associated capacitor that exceeds a threshold current level.

18. The PV power conditioning unit of claim 12 wherein the control circuit disconnects at least one of the capacitors based on a detected temperature going beyond a threshold temperature.

19. The PV power conditioning unit of claim 18 wherein the detected temperature is a temperature of at least one of: an enclosure of the PV power conditioning unit, a heatsink of the PV power conditioning unit and at least one of the one or more capacitors.

\* \* \* \* \*